United States Patent [19]

Yu

[11] Patent Number: 5,058,066
[45] Date of Patent: Oct. 15, 1991

[54] OUTPUT BUFFER PRECHARGE CIRCUIT FOR DRAM

[75] Inventor: Jaiwhan Yu, Suwon, Rep. of Korea

[73] Assignee: Samsung Electronics Co., Ltd., Rep. of Korea

[21] Appl. No.: 485,914

[22] Filed: Feb. 27, 1990

[30] Foreign Application Priority Data

Jun. 15, 1989 [KR] Rep. of Korea .................. 89-8263

[51] Int. Cl.$^5$ ............................................. G11C 7/00
[52] U.S. Cl. ................................. 365/189.05; 365/203
[58] Field of Search .............. 365/189.05, 203, 233.5; 307/475

[56] References Cited

U.S. PATENT DOCUMENTS

| | | | |
|---|---|---|---|
| 4,604,731 | 8/1986 | Konishi | 365/189.05 |
| 4,716,550 | 12/1987 | Flannagan et al. | 365/189.05 |
| 4,827,454 | 5/1989 | Okazaki | 365/233.5 |
| 4,893,276 | 1/1990 | Okuyama | 365/233.5 |
| 4,922,458 | 5/1990 | Watanabe et al. | 365/189.05 |

Primary Examiner—Glenn Gossage
Attorney, Agent, or Firm—Lowe, Price, LeBlance and Becker

[57] ABSTRACT

An output buffer precharge circuit for DRAM (dynamic random access memory) cells includes a latch, control circuits, an output buffer, and a precharge pulse generating section. The circuit further includes a data transition signal genrating section consisting of MOS (metal-oxide semiconductor) transistors, latches connected to the MOS transistors, inverters and NAND gates for receiving the control precharge pulse from the precharge pulse generating section; and a precharge section consisting of MOS transistors, the gates of which receive the outputs of the data transition signal generating section. Noise can be decreased during the transition from the CMOS level to the TTL (transistor-transition-logic) level, and valid data are charged or discharged in advance so that processing speed can be increased.

1 Claim, 3 Drawing Sheets

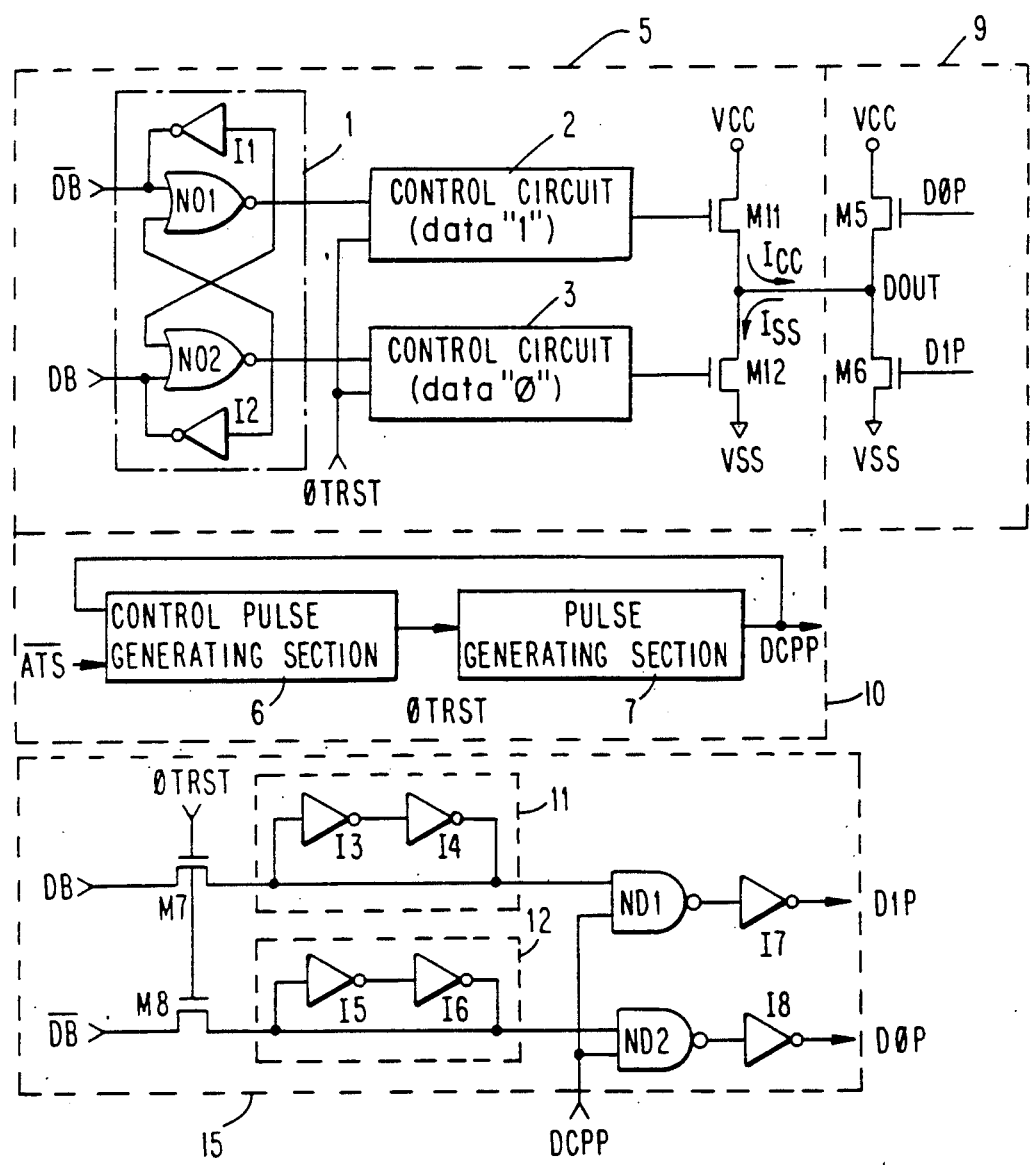

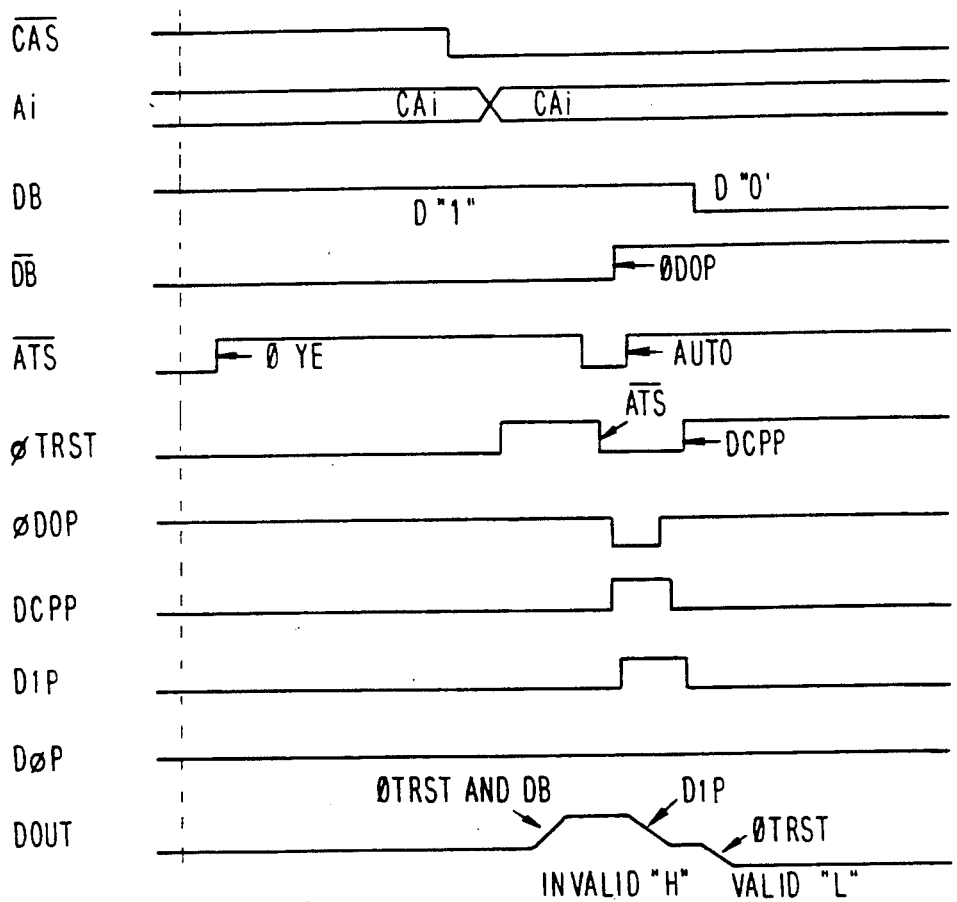
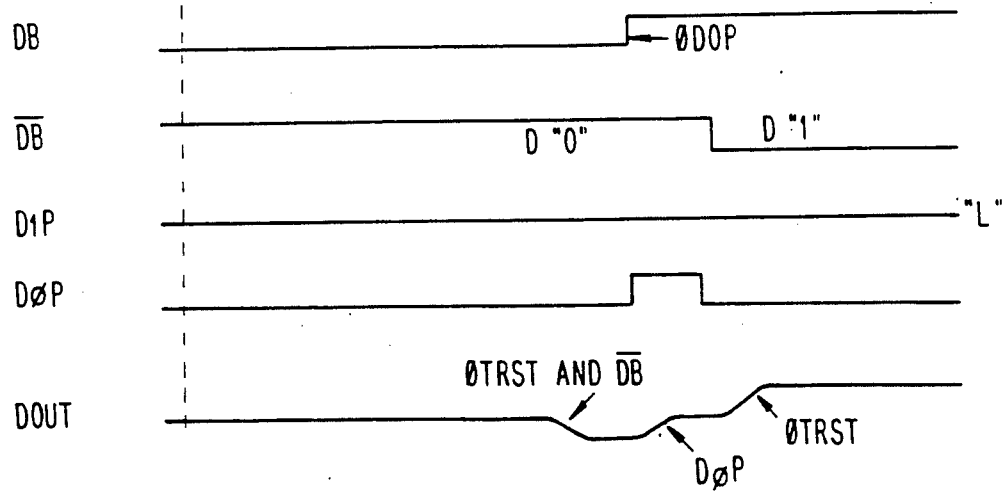

OUTPUT BUFFER PRECHARGE CIRCUIT FOR DRAM

BACKGROUND OF THE INVENTION

The present invention relates to a control circuit for a buffer for outputting data from a memory device, and particularly to an output buffer precharge control circuit for use in detecting an address transition in which the output node is shifted to a desired level before the valid data is outputted by arranging that, when a node is precharged to invalid data, the precharge path is divided according to whether the invalid data is "∅" or "1", and if the output data is "1", the output node is discharged, while, if the output data is "∅", the output node is charged.

A semiconductor memory device writes external data into the internal memory cells, and, if required, reads out to output the stored data from the internal memory cells. A number of internal steps are performed in carrying out such readings and writings.

The procedure of outputting data consists of a plurality of steps;

supply of column address signal→input/output (I/O) gating responsive thereto and connecting a signal through a bit line to an input/output line→supplying a data enable signal selecting→a data bus→outputting data.

That is, if a column address signal is supplied, then a gating pulse for selecting an I/O terminal is emitted and then, an I/O line is selected. Then, at the steps of connecting a signal to the I/O line and supplying the data enable signal, a second data sensing is carried out to step up the small voltage of the I/O line to a higher voltage, to select a data bus, and to output a data signal.

A data signal conversion is required between the data bus and the data output such that the signal level which has been a CMOS level before the data bus has to become a TTL level in its output. Accordingly, an output buffer is used in order to shift the level of the signal.

A circuit as shown in FIGS. 1 and 2 has been used conventionally for the level shifting of the output buffer, but the precharge section 9 of FIG. 1 is kept in a turned-on or turned-off state together with MOS transistors M1, M2 owing to the function of a control precharge pulse DCPP, with the result that a DC current loss is caused, thereby making it impossible to maintain the precharge level at a high impedance state.

Meanwhile, in the circuit of FIG. 2, the DC current dissipation can be prevented through a gating by means of the control precharge pulse DCPP, but in the case where the invalid data has a level of "1", the DC current dissipation can not be avoided, and the use of a large size MOS transistor is required in the precharge section 9.

SUMMARY OF THE INVENTION

The present invention is intended to overcome the above described disadvantages of the conventional technique.

Therefore it is an object of the present invention to provide an output buffer precharge control circuit in which the noise occurring at the output side of the precharge section can be eliminated, and the data processing speed can be improved in a circuit controlled by detecting the address transition.

It is another object of the present invention to provide a precharge control circuit in which the precharge section may consist of NMOS transistors based on consideration of the reliability of the latch up and similar effects at the output side.

In achieving the above objects, the MOS transistors constituting the precharge section according to the present invention are driven in such a manner that: different ones of the MOS transistors are driven in accordance with the data status ("1" or "∅") of an invalid data; upon supplying of an H level ("1") valid data, the precharge section is permitted to form a charge path to elevate the overall level and to output a TTL level signal at a high speed; and upon supplying of an L level ("∅") of a valid data, the precharge section forms a discharge path so as to lower the overall level, and so that a TTL level can be brought out at a high speed.

In achieving the above objects, the circuit for precharging in accordance with the status of the invalid data at the output side in order to shift a CMOS level to a TTL level is characterized in that the output side of the output buffer is charged or discharged according to the invalid data from a data signal generating section, and in that the level of the output side is dropped or raised in advance before outputting the next supplied valid data through the output side of the output buffer.

BRIEF DESCRIPTION OF THE DRAWINGS

The above objects and other advantages of the present invention will become more apparent by describing in detail the preferred embodiment of the present invention with reference to the attached drawings in which:

FIG. 3 illustrates the output buffer precharge control circuit according to the present invention; and FIGS. 4A and 4B illustrate time charts showing the operations of precharging the output buffer according to the present invention.

DETAILED DESCRIPTION OF THE INVENTION

Figure 1:
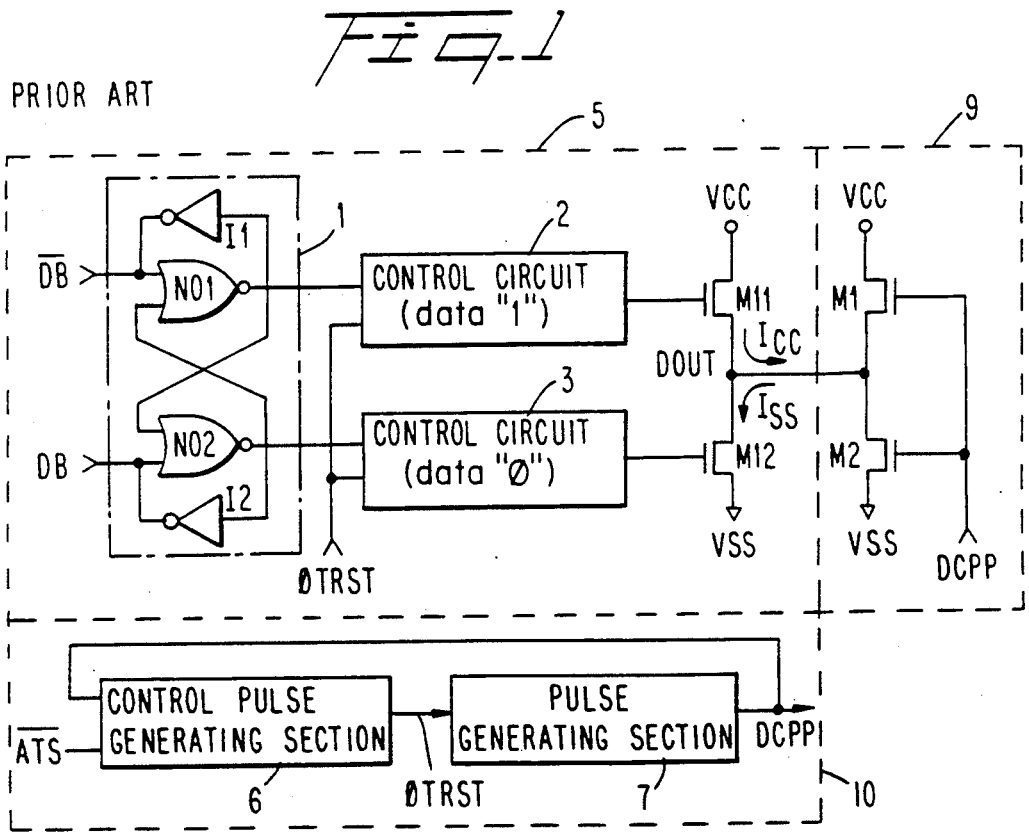
FIG. 1 illustrates a conventional output buffer precharge control circuit for use in a memory device.

FIG. 1 illustrates a conventional output buffer precharge control circuit for use in a conventional memory device.

In this drawing, the output buffer 5 comprises: a latch 1 for receiving data signals DB, $\overline{DB}$ of a data bus; control circuits 2, 3 for processing the data by means of control signals ∅TRST and status signals of the latch 1; and MOS transistors M11, M12 for outputting the signals of the control circuits 2, 3.

At the rear of the output buffer 5, there is provided a precharge section 9 which consists of MOS transistors M1, M2. A control precharge pulse generating section 10 consists of; a control pulse generating section 6 for generating control pulses after receipt of address transition signals $\overline{ATS}$; and a pulse generating section 7 for generating control precharge pulses DCPP after receipt of the signals of the control pulse generating section 6.

Such a circuit is for use in a DRAM memory device of one to four megabytes, and in this circuit, if a 3-state control pulse ∅TRST is generated by the control pulse generating section 6 in response to the address transition signal $\overline{ATS}$ during an address transition, the pulse generating section 7 generates a control precharge pulse DCPP of 4–5 ns upon receipt of the falling edge of the control pulse ∅TRST.

After generation of the control precharge pulse DCPP, the control precharge pulse DCPP is supplied to the gates of the MOS transistors M1, M2 of the precharge section 9 in an L level in a manner described below.

Upon supplying of the L level signal to the gates of the MOS transistors M1, M2 after the generation of a 3-state control pulse ∅TRST, the gates are kept in a turned-off state, and therefore, the output side DOUT comes to have a high impedance state.

Then, if a control precharge pulse DCPP of a high level is supplied to the gates of the MOS transistors M1, M2 during the next cycle, then the MOS transistors M1, M2 are turned on, so that the invalid data level of the output side DOUT should be shifted to an intermediate level, thereby improving the speed and reducing the noise due to the peak value of the current ICC and ISS during the next outputting of valid data, where Icc is the current which flows from Vcc to the output node Dout through a pull up transistor $M_{11}$ in case that invalid data is 'L', valid data is 'H' and also valid data is outputted. Iss is the current which flows from node Dout to Vss (ground) through pull down transistor $M_{12}$ in case that invalid data is 'H', valid data is 'L' and also valid data is outputted.

However, in spite of such an advantage, the above described conventional circuit has the disadvantages that, if an invalid data is "1", the MOS transistor M2 is turned on together with the MOS transistor M1, and if an invalid data is "∅", the MOS transistor M1 is turned on together with the MOS transistor M2, with the result that a DC current dissipation path is formed, thereby creating a difficulty in maintaining the precharge level at a high impedance.

Figure 2:
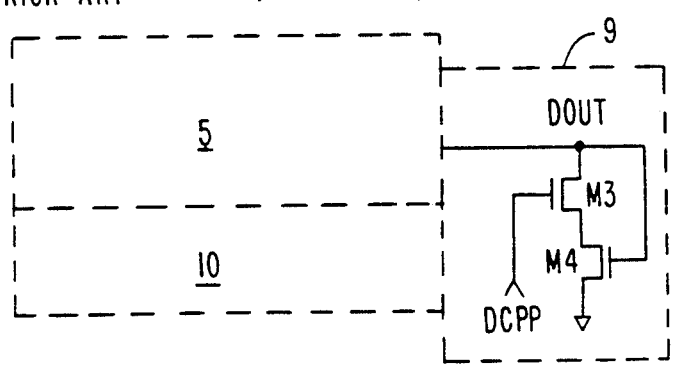
FIG. 2 illustrates another conventional output buffer precharge control circuit.

FIG. 2 illustrates another conventional output buffer precharge control circuit which is used in a memory device such as an EEPROM.

In this circuit, the output buffer 5 and the control precharge pulse generating section 10 have the same constitutions as those of FIG. 1. But the precharge section 9 which is connected to the output side DOUT of the output buffer 5 comprises: a MOS transistor M4 having a gate connected to the above mentioned output side DOUT; and a MOS transistor M3 connected between the output side DOUT and the MOS transistor M4, while the MOS transistor M3 is driven by means of the control precharge pulse DCPP.

This circuit has the advantage that the current ISS due to the control precharge pulse DCPP occurring at the time of the gating can be reduced, but has the disadvantages that an improvement of the speed and a reduction of the peak current ISS can not be achieved, and also that a large size MOS transistor is required.

The present invention is intended to overcome the disadvantages which are encountered in the circuits of FIGS. 1 and 2 as described above.

FIG. 3 illustrates an embodiment of the circuit according to the present invention.

The circuit according to the present invention comprises an output buffer precharge circuit for DRAM cells, including an output buffer, which has:

a latch 1 whereto the data signal from a data bus (DB), ($\overline{DB}$) is supplied; control circuits 2, 3 for outputting data "1" or "∅" after receipt of the outputs of the latch 1 and a control signal ∅TRST; MOS transistors M11, M12 driven by outputs of control circuits 2, 3; a precharge pulse generating section 10 which includes a control pulse generating section 6 for generating 3-state control signals ∅TRST in response to the address transition signals $\overline{ATS}$, and a pulse generating circuit 7 for outputting control precharge pulses; and a precharge section 9 for receiving outputs DOUT of said output buffer 5.

The circuit, that is, the output buffer precharge circuit, further includes a data transition signal generating section 15 for supplying data signal D∅P, D1P to the precharge section 9, which includes:

MOS transistors M7, M8 for selectively transmitting data signals DB, $\overline{DB}$; latches 11, 12 for latching outputs from MOS transistors M7, M8; inverters 17, 18 and NAND gates ND1, ND2 for respectively ANDing the output signals of latches 11, 12 with the control precharge pulse DCPP from the precharge pulse generating section 10.

The circuit is further characterized in that the precharge section 9 includes MOS transistors M5, M6, the gates of which respectively receive the data output signals D∅P, DIP from the transistor signal generating section.

In the above described constitution, the data signal supplied to the data buses $\overline{DB}$, DB is a data transmitted through an I/O sensing to the output side DOUT, while the 3-state signal ∅TRST is enabled after being delayed at the falling edge of a column address strobe signal $\overline{CAS}$, and has the function of determining whether the data is to be outputted to the output node.

As shown in FIG. 4A, the control precharge pulse DCPP terminates the control signal ∅TRST in response to the falling edge of the address transistion signal $\overline{ATS}$, and during the falling edge, a pulse AUTO having a predetermined pulse width is generated.

A data bus line charge pulse D∅P, which has the function of precharging the nodes of the data bus line DB and the data enable signal supply line during the time when the address transition signal $\overline{ATS}$ is in an L level.

First, the driving of the circuit of the present invention will be described broadly. In the case where a data of "∅" is loaded on the data bus $\overline{DB}$ of the output buffer 5, and where a data of "1" is loaded on the data bus DB, the output of the NOR gate NO1 becomes "1" through the latch 1, and the output of the NOR gate NO2 becomes "∅".

Then, the outputs of the NOR gates NO1, NO2 and the control signal ∅TRST are compared with each other, and consequently, an H level signal is outputted to the control circuits 2, 3.

If the control circuit 2 having a data "1" is activated, then an H level signal is supplied to the gate of the MOS transistor M11 in order to cause the output side DOUT to become a "1" level state (H level state), while, if the control circuit 3 having a data "∅" is activated, then an H level signal turns on the MOS transistor M12 for the output side DOUT to become an H level state.

Thus, when a CMOS level is translated to a TTL level, if the output side keeps an H level, the precharge section 9 turns on the MOS transistor M5 in advance for the power source Vcc to be supplied and for a level-increasing high impedance to be achieved, while, if the output side DOUT is kept at an L level, the precharge section 9 turns on the MOS transistor M6 in advance for an L level to be maintained.

Under this condition, the output of the data transition signal generating section 15 is used for causing a variation in advance in the impedance of the precharge section 9.

Now the operation of the circuit of the present invention for the case of an invalid data of "1" state will be described referring to FIG. 4A.

If a column address strobe signal ($\overline{CAS}$ signal) is generated externally to drive the DRAM chip, then an L level signal is detected, and a column address signal Ai is generated.

An H level invalid data is provided at the column address Ai during the span of time for the address CAi, while, an L level valid data is provided to the same during the span of time for the address CAj.

Now if an address transition signal $\overline{ATS}$ is supplied to the precharge pulse generating section 10, then a 3-state control signal ∅TRST is outputted through the control pulse generating section 6. The address transition signal $\overline{ATS}$ is formed by the column address signal Ai and an I/O gating enable signal ∅YE, which indicates that data of a bit line can be provided to the input/output line after conclusion of bit line sensing, and is repeated with a predetermined pulse width AUTO.

The 3-state control signal ∅TRST is supplied to the control circuits 2, 3 of the output buffer 5 to select the signals outputted through the control circuits 2, 3. Further, the 3-state control signal ∅TRST is supplied to the pulse generating section 7 to generate an output side control precharge pulse on the output side DOUT of the output buffer 5.

Under this condition also, a certain pulse period of the pulse width AUTO is provided by the pulse generating section 7. The pulse width of this pulse period is of such a nature that the output side DOUT can be maintained at a sufficiently high impedance within the precharge period, and the data bus line performs the function of precharging the data enable signal supply line and the data bus DB during the time when the address transition signal $\overline{ATS}$ is kept at a low level. The control precharge pulse DCPP is inputted into the data transition signal generating section 15 so that the outputting of the data signals D1P, D∅P should be determined.

The data transition signal generating section 15 is operated in such a manner that, upon supplying of the 3-state control signal ∅TRST, the data of the data buses DB, $\overline{DB}$ should be supplied through the MOS transistors M7, M8, and the data D1P, D∅P should be outputted through the latches 11, 12 owing to the function of the AND circuit consisting of the NAND gates ND1, ND2 and the inverters I7, I8.

Thus as shown in the above-mentioned time charts, the 3-state control signal ∅TRST is supplied to the latches 11, 12 during the time when an invalid data is supplied to the output side DOUT of the output buffer 5 at an H level.

When the control precharge pulse DCPP is enabled, the data D∅P, D1P are generated in accordance with the state of the invalid data which is supplied through the data buses $\overline{DB}$, DB. If the invalid data is "1", the data D1P will have an H level, and the data D∅P will have a L level, while, if the invalid data is "∅", the data D∅P will generate a signal of an H level in order to cause them to be supplied to the gates of the MOS transistors M1, M2 of the precharge section 9.

Meanwhile, the data signals which are supplied through the data buses DB, $\overline{DB}$ are supplied through the latch 1 consisting of the NOR gates NO1, NO2 and the inverters I1, I2 to the control circuits 2, 3, while, in the control circuits 2, 3, the 3-state control signals ∅TRST are supplied to the gates of the MOS transistors M11, M12.

As a result, if the invalid data is "1", the data signal D1P will have an H level to turn on the MOS transistor M6 of the precharge section 9, and therefore, the power of the output side DOUT is discharged to flow to the MOS transistor M6, thereby lowering the impedance.

On the other hand, if the invalid data is "∅", the data signal D∅P will have an H level to turn on the MOS transistor M6. Accordingly, the power source Vcc is supplied to the output side DOUT to charge it in order to cause a high impedance to be maintained, and thus, when a valid data is outputted, the output side impedance will be adjusted in advance so as not to be affected by the invalid data, thereby decreasing the noise to a great degree and improving the speed, also to a great degree.

To look at the output side DOUT in FIG. 4A, if the invalid data is an H level, an output consisting of a combination of the control signal ∅TRST and the data bus DB status signal is produced, and if the invalid data is "1", the MOS transistor M6 is turned on to lower the level primarily together with the data signal D1P, while the level which has been lowered secondly by means of the 3-state control signal ∅TRST is maintained, thereby lowering the overall precharged level.

Accordingly, the valid data supplied to the next address segment CAj is loaded on the lowered level, thereby decreasing the noise and improving the speed.

Now a description will be made of the level of the output side DOUT for the case where the invalid data has an L level as shown in FIG. 4B.

In this case, as in the case of FIG. 4A, an invalid data "∅" will be loaded in the segment of the address CAi of the column address Ai, while a valid data "1" will be loaded in the segment of the address CAj.

Therefore, the output side DOUT will give an output consisting of a combination of the 3-state control signal ∅TRST and a data bus ($\overline{DB}$) status signal with the invalid data being in an L level, and the MOS transistor M5 is turned on in a state of "∅" of the invalid data, in order to elevate the level primarily together with the data signal D∅P, and to elevate the level secondly by means of the 3-state control signal ∅TRST. Accordingly, the valid data loaded in the next segment of the address CAj is loaded on the elevated level, thereby decreasing the noise and improving the speed.

As described above, according to the present invention, the output side is charged or discharged according as the state of the invalid data is "1" or "∅", with the result that the noise can be decreased during the transition from the CMOS level to the TTL level so as to increase the margin of the level, and with a further result that valid data are charged or discharged in advance so as to increase the processing speed.

Particularly, the precharge section according to the present invention uses n-channel MOS transistors, with the result that reliability can be assured during operations such as latch-up and the like, thereby making it possible to use small capacity MOS transistors in the output buffer.

What is claimed is:

1. An output buffer precharge circuit for dynamic random access memory (DRAM) cells, including an output buffer 5 having a latch 1; control circuits 2, 3 for outputting data after receipt of outputs of said latch 1 and a control signal ∅TRST; MOS transistors driven by outputs of said control circuits 2, 3; a precharge pulse generating section 10 for outputting control precharge pulses DCPP in response to address transition signals $\overline{ATS}$; and a precharge section 9 for receiving outputs DOUT of said output buffer 5;

characterized in that said output buffer precharge circuit further comprises a data transition signal generating section 15 comprising:

MOS transistors M7, M8 for receiving said control signal ØTRST at respective gates thereon and for selectively transmitting data signals DB, $\overline{DB}$ as data signals D1P, DØP respectively to be supplied to said precharge section 9; latches 11, 12 connected to said MOS transistors M7, M8; NAND gates ND1, ND2 for receiving said control precharge pulse DCPP from said precharge pulse generating section 10, and inverters I7, I8, outputs of said NAND gates being respectively connected to inputs of said inverters;

and wherein said precharge section 9 comprises MOS transistors M5, M6, the gates of which respectively receive said data signals DØP, D1P from said transition signal generating section 15.

* * * * *